United States Patent
Glodde et al.

(10) Patent No.: US 8,999,625 B2
(45) Date of Patent: Apr. 7, 2015

(54) SILICON-CONTAINING ANTIREFLECTIVE COATINGS INCLUDING NON-POLYMERIC SILSESQUIOXANES

(71) Applicants: International Business Machines Corporation, Armonk, NY (US); Shin-Etsu Chemical Co., Ltd., Joetsu-shi, Niigata-ken (JP)

(72) Inventors: Martin Glodde, Mahwah, NJ (US); Wu-Song Huang, Brewster, NY (US); Javier Perez, Wappingers Falls, NY (US); Ratnam Sooriyakumaran, San Jose, CA (US); Takeshi Kinsho, Joetsu (JP); Tsutomu Ogihara, Joetsu (JP); Seiichiro Tachibana, Joetsu (JP); Takafumi Ueda, Joetsu (JP)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 13/767,114

(22) Filed: Feb. 14, 2013

(65) Prior Publication Data

US 2014/0227641 A1 Aug. 14, 2014

(51) Int. Cl.
*G03F 7/075* (2006.01)
*G03F 7/09* (2006.01)
(Continued)

(52) U.S. Cl.
CPC .............. *G03F 7/20* (2013.01); *G03F 7/0757* (2013.01)

(58) Field of Classification Search
None
See application file for complete search history.

(56) References Cited

U.S. PATENT DOCUMENTS 5,886,102 A 3/1999 Sinta et al.
5,939,236 A 8/1999 Pavelchek et al.
(Continued)

FOREIGN PATENT DOCUMENTS

JP 2009215423 9/2009
JP 2012511619 5/2012
(Continued)

OTHER PUBLICATIONS

International Search Report/Written Opinion; dated Nov. 6, 2014 PCT/US014/012624.

*Primary Examiner* — Sin J. Lee
(74) *Attorney, Agent, or Firm* — H. Daniel Schnurmann; L. Jeffrey Kelly

(57) ABSTRACT

Embodiments include a silicon-containing antireflective material including a silicon-containing base polymer, a non-polymeric silsesquioxane material, and a photoacid generator. The silicon-containing base polymer may contain chromophore moieties, transparent moieties, and reactive sites on an $SiO_x$ background, where x ranges from approximately 1 to approximately 2. Exemplary non-polymeric silsesquioxane materials include polyhedral oligomeric silsesquioxanes having acid labile side groups linked to hydrophilic groups. Exemplary acid labile side groups may include tertiary alkyl carbonates, tertiary alkyl esters, tertiary alkyl ethers, acetals and ketals, Exemplary hydrophilic groups may include phenols, alcohols, carboxylic acids, amides, and sulfonamides. Embodiments further include lithographic structures including an organic anti-reflective layer, the above-described silicon-containing anti-reflective layer above the organic anti-reflective layer, and a photoresist layer above the above-described silicon-containing anti-reflective layer. Embodiments further include a method of forming a lithographic structure utilizing the above-described silicon-containing anti-reflective layer.

17 Claims, 4 Drawing Sheets

(51) Int. Cl.
*G03F 7/20* (2006.01)
*G03F 7/30* (2006.01)
*G03F 7/36* (2006.01)

(56) References Cited

U.S. PATENT DOCUMENTS

| | | | |
|---|---|---|---|
| 5,981,398 A | 11/1999 | Tsai et al. | |
| 6,340,734 B1 | 1/2002 | Lin et al. | |
| 6,420,088 B1 | 7/2002 | Angelopoulos et al. | |
| 6,730,454 B2 | 5/2004 | Pfeiffer et al. | |
| 7,141,692 B2 | 11/2006 | Allen et al. | |
| 7,399,573 B2 | 7/2008 | Huang et al. | |
| 7,399,581 B2 | 7/2008 | Allen et al. | |
| 7,550,254 B2 | 6/2009 | Sooriyakumaran et al. | |
| 8,025,927 B2 | 9/2011 | Fu et al. | |
| 8,026,293 B2 | 9/2011 | Allen et al. | |
| 8,293,454 B2 | 10/2012 | Angelopoulos et al. | |
| 2005/0031964 A1* | 2/2005 | Babich et al. | 430/5 |
| 2005/0112382 A1* | 5/2005 | Allen et al. | 428/447 |
| 2006/0063103 A1* | 3/2006 | Huang et al. | 430/270.1 |
| 2007/0015083 A1 | 1/2007 | Babich et al. | |
| 2007/0254235 A1* | 11/2007 | Allen et al. | 430/270.1 |
| 2009/0061355 A1* | 3/2009 | Angelopoulos et al. | 430/272.1 |
| 2009/0189317 A1 | 7/2009 | Sato et al. | |
| 2010/0279025 A1 | 11/2010 | Fu et al. | |
| 2011/0079579 A1 | 4/2011 | Allen et al. | |

FOREIGN PATENT DOCUMENTS

| | | |
|---|---|---|
| JP | 2012511742 | 5/2012 |
| KR | 1020070002602 | 1/2007 |
| KR | 100967677 | 6/2010 |
| KR | 101007819 | 1/2011 |

\* cited by examiner

SILICON-CONTAINING ANTIREFLECTIVE COATINGS INCLUDING NON-POLYMERIC SILSESQUIOXANES

FIELD OF THE INVENTION

The present invention relates generally to a process of making a lithographic structure using antireflective materials, and more specifically to incorporating non-polymeric silsesquioxanes into a silicon-containing antireflective coating (SiARC).

BACKGROUND

In the microelectronics industry as well as in other industries involving construction of microscopic structures (e.g., micromachines, magnetoresistive heads, etc.), there is a continued desire to reduce the size of structural features. In the microelectronics industry, the desire is to reduce the size of microelectronic devices and/or to provide a greater amount of circuitry for a given chip size.

Effective lithographic techniques may lead to a reduction of feature sizes. Lithography impacts the manufacture of microscopic structures not only in terms of directly imaging patterns on the desired substrate, but also in terms of making masks typically used in such imaging. Typical lithographic processes involve formation of a patterned photoresist layer by pattern-wise exposing the radiation-sensitive resist to an imaging radiation. The image is subsequently developed by contacting the exposed resist layer with a material to selectively remove portions of the resist layer to reveal the desired pattern. The pattern is subsequently transferred to an underlying material by etching the underlying material in openings of the patterned resist layer. After the transfer is complete, the remaining resist layer is then removed.

An exemplary lithographic process is depicted in FIGS. 1A-1C. Referring to FIG. 1A, a photoresist layer 30 may be formed above an underlying material layer 10. In some lithographic imagining processes, the photoresist layer 30 may not provide sufficient resistance to subsequent etching steps to enable the effective transfer of the desired pattern to the underlying material layer 10. In such cases, a hard mask layer 20 may therefore be used between the photoresist layer 30 and the underlying material layer 10. The hard mask layer 20 receives the pattern from the patterned resist layer and should be able to withstand the etching processes needed to transfer the pattern to the underlying material. The hard mask may further have anti-reflective properties to improve the resolution of the image patterned in the photoresist by limiting the reflection of the exposing radiation off the underlying layer 30.

Referring to FIG. 1B, the photoresist layer 30 (FIG. 1A) may be developed by, for example, passing exposing radiation 50 through a pattern mask 40 containing transparent portions 40a and opaque portions 40b, resulting in exposed portions 30a and unexposed portions 30b of the photoresist layer 30 (FIG. 1A). In a negative tone development system, the unexposed portions 30b may be removed by a developer while the exposed portions 30a are resistant to the developer.

Prior to developing the photoresist layer 30 (FIG. 1A), the photoresist layer 30 adheres well to the hard mask layer 20, due in part to similar degrees of hydrophilicity. However, after developing the photoresist layer 30 using a negative tone development system, the exposed portions 30a may become hydrophilic, resulting in poor adhesion to the relatively hydrophobic hard mask layer 20. Referring to FIG. 1C, this poor adhesion may lead to image collapse, where the exposed portions 30a do not remain in adhered to the hard mask layer 20. Therefore, a negative tone development system that maintains adhesion between the photoresist and the hard mask after developing the photoresist is desirable.

SUMMARY

The present invention relates to silicon-containing antireflective coatings. According to at least one exemplary embodiment, an antireflective coating may include a silicon-containing base polymer, a non-polymeric silsesquioxane material, and a photoacid generator. The silicon containing base polymer may be made of one or more of the following monomers: a chromophore moiety, a transparent moiety, and a reactive site for reaction with a crosslinking component. Exemplary non-polymeric silsesquioxane materials may include polyhedral oligomeric silsesquioxane (POSS) having hydrophilic side groups, for example of phenols, alcohols, carboxylic acids, amides, and sulfonamides, protected with acid labile functionalities, for example tertiary alkyl carbonates, tertiary alkyl esters, tertiary alkyl ethers, acetals and ketals.

According to another exemplary embodiment, a lithographic structure may include an organic antireflective layer, a silicon-containing antireflective layer above the organic antireflective layer. Exemplary organic anti-reflective layers may include comprising poly(4-hydroxystyrene), co-polymers of 4-hydroxystyrene with up 40% by weight of alkyl methacrylate, alkylacrylate, and/or styrene, novolac resins, acrylate polymers, methacrylate polymers, fluorocarbon polymers, cycloaliphatic polymers such norbornene-based and maleic anhydride polymers, poly(3-hydroxystyrene), poly(acrylic acid), poly(norbornene carboxylic acid), copolymers of (4-hydroxystyrene and styrene), copolymers of 4-hydroxystyrene and acrylic acid, copolymers of styrene and acrylic acid, and copolymers of norbornene and maleic anhydride. The silicon containing-antireflective coating may include a silicon-containing base polymer, a non-polymeric silsesquioxane material, and a photoacid generator. The silicon containing base polymer may be made of one or more of the following monomers: a chromophore moiety, a transparent moiety, and a reactive site for reaction with a crosslinking component. Exemplary non-polymeric silsesquioxane materials may include polyhedral oligomeric silsesquioxane (POSS) having hydrophilic side groups, for example of phenols, alcohols, carboxylic acids, amides, and sulfonamides, protected with acid labile functionalities, for example tertiary alkyl carbonates, tertiary alkyl esters, tertiary alkyl ethers, acetals and ketals.

Another exemplary embodiment may include a method of forming a lithographic structure. The method may include providing a substrate, depositing an organic antireflective layer above the substrate, depositing a silicon-containing antireflective layer including a silicon-containing base polymer, a non-polymeric silsesquioxane material, and a photoacid generator above the organic antireflective coating, and depositing a photoresist layer suitable for negative tone development systems above the silicon-containing antireflective layer. The photoresist layer may then be patternwise exposed to radiation to create regions exposed to radiation and regions not exposed to radiation in the photoresist layer, and then developed to form a pattern in the photoresist layer including the regions of the photoresist layer exposed to radiation. The pattern then may be transferred from the photoresist layer into the silicon-containing antireflective layer, from the silicon-containing antireflective layer into the organic antireflective layer, and finally from the organic antireflective layer into the substrate.

Figure 1A:
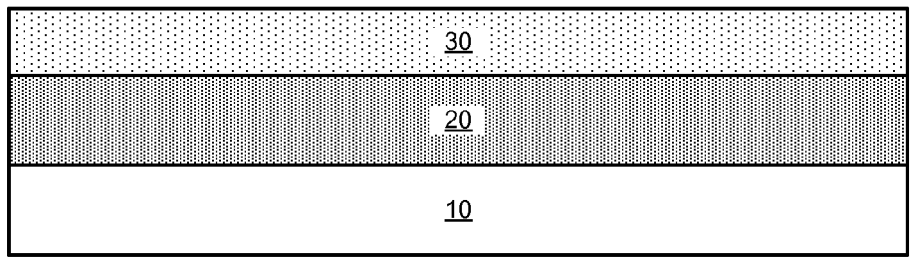
FIG. 1A is a cross-sectional front elevational view of an antireflective layer and a photoresist layer over a substrate, according to the prior art.
Figure 1B:
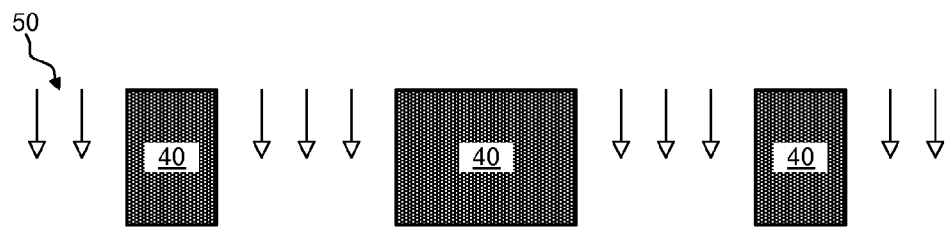
FIG. 1B is a cross-sectional front elevational view of developing the photoresist layer shown in FIG. 1A, according to the prior art.
Figure 1C:
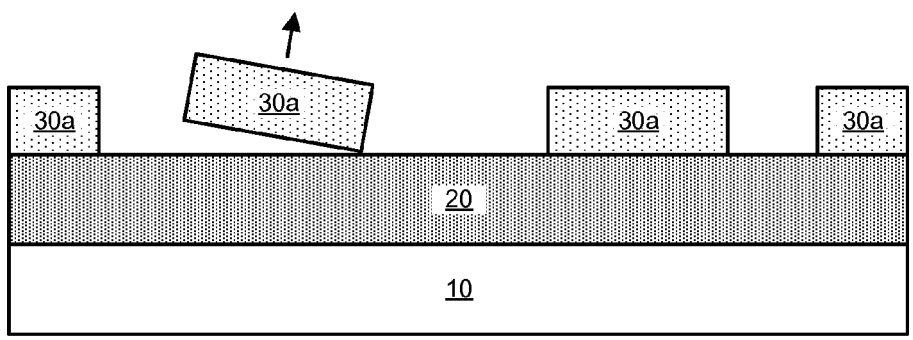
FIG. 1C is a cross-sectional front elevational view of removing unexposed portions of the photoresist layer shown in FIG. 1B, according to the prior art.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the invention encompass antireflective coatings which are useful in lithographic processes. Embodiments are characterized by the incorporation of non-polymeric silsesquioxanes into a silicon-containing antireflective coating (SiARC). Embodiments also encompass lithographic structures containing SiARCs with non-polymeric silsesquioxanes, methods of making such lithographic structures, and methods of using such lithographic structures to pattern an underlying substrate.

Figure 2A:
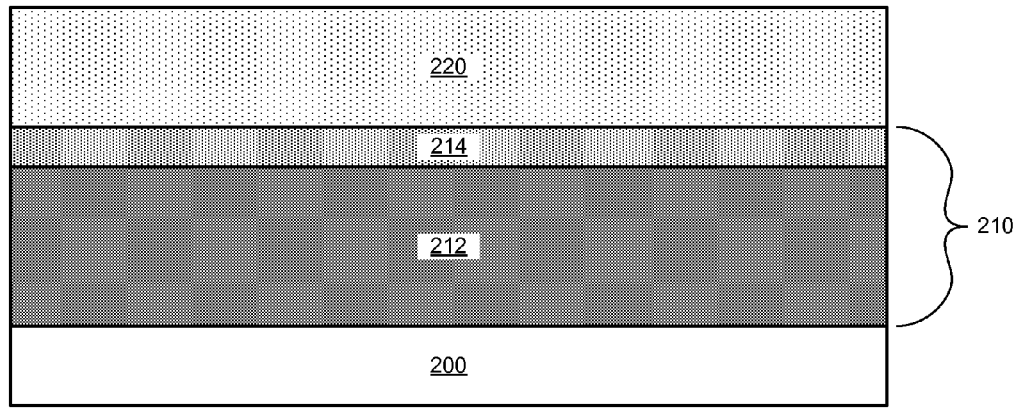
FIG. 2A is a cross-sectional front elevational view of an organic antireflective layer, a silicon antireflective layer, and a photoresist layer above a substrate, according to an embodiment of the present invention.

Referring to FIG. 2A, an anti-reflective coating (ARC) layer 210 and a photoresist layer 220 may be formed above a substrate 200. The substrate 200 may be, for example, a metal conductor layer, a ceramic insulator layer, a semiconductor layer or other material depending on the stage of the manufacturing process.

The ARC layer 210 may comprise an organic antireflective layer 212 and a SiARC layer 214. The organic antireflective layer 212 may be made of an organic polymer containing the elements of carbon, hydrogen, oxygen, and nitrogen, and mixtures thereof, that can be spin applied and crosslinked with a heat treatment. Typical organic polymers suitable for this invention are being used in lithographic applications such as organic ARCs or as planarizing undermaterials in biomaterial or other multi-material lithographic schemes. The selection of which organic polymer to use will depend on several characteristics such as solubility, optical properties, thermal properties, mechanical properties, etch selectivity, and film forming ability. The organic polymer may have a plurality of may have a plurality of different chemical groups each having a specific function in the overall performance of the material. Optical properties, mode of insolubilization, solubility enhancement, and etch resistance are among the properties that can be tailored by the selection of the chemical groups.

Examples of suitable organic polymers include, for example, poly(4-hydroxystyrene), co-polymers of 4-hydroxystyrene with up 40% by weight of alkyl methacrylate, alkylacrylate, and/or styrene, novolac resins, acrylate polymers, methacrylate polymers, fluorocarbon polymers, and cycloaliphatic polymers such norbornene-based and maleic anhydride polymers. In particular, the organic antireflective layer 212 may be made of poly(3-hydroxystyrene), poly(acrylic acid), poly(norbornene carboxylic acid), copolymer of (4-hydroxystyrene and styrene), copolymers of 4-hydroxystyrene and acrylic acid, copolymers of styrene and acrylic acid, or copolymers of norbornene and maleic anhydride. Other suitable organic polymers include novolake resins containing substituted and unsubstituted naphthalenes or naphthols, homopolymer or copolymers containing vinyl naphthalenes or acenaphthalenes.

In some embodiments, the organic antireflective layer 212 may not be present. In embodiments where the organic antireflective layer 212 is present it may be formed by spin-coating the organic polymer onto the substrate 200, heating the organic polymer to remove any solvent and crosslink the organic polymer. The organic antireflective layer 212 may be used, for example, to improve etch selectivity between the ARC layer 210 and the substrate 200 compared to the SiARC layer 214. Further, the organic antireflective layer 212 may provide control of topographic variations in the substrate 200 and provide a more planar surface on which the SiARC layer 214 and the photoresist layer 220 may be formed.

The SiARC layer 214 may include (i) a silicon-containing base polymer, (ii) a non-polymeric silsesquioxane material, and (iii) a photoacid generator (PAG). By weight, the SiARC layer 214 may contain approximately 80 to approximately 99 wt. % of silicon-containing base polymer, preferably approximately 90 to approximately 98 wt. %, approximately 0.5 to approximately 10 wt. % of non-polymeric silsesquioxanes, preferably approximately 1 to approximately 5 wt. %, and approximately 0.5 to approximately 10 wt. % of PAG, preferably approximately 1 to approximately 5 wt. %.

The silicon-containing base polymer may contain one or more monomers having structures selected from (I) to (III) below:

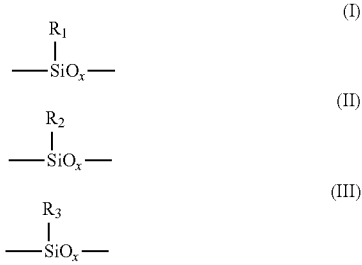

where x ranges from approximately 1 to approximately 2, $R_1$ is a chromophore moiety, $R_2$ is a transparent moiety, and $R_3$ is a reactive site for reaction with a crosslinking component. For linear organosiloxane polymers, x would be approximately 1. For silsesquioxane polymers, x may be approximately 1.5. For silsesquioxane polymers containing a $SiO_2$ component, x may be between approximately 1.5 and approximately 2.0. The $SiO_2$ component in the polymer may be obtained by adding tetraalkoxysilane, tetrachlorosilane, or tetrabromosilane in the synthesis of the silicon containing polymer. In some embodiments, polymers having x greater than approximately 1.5 are preferred due to superior etch resistance. In some embodiments, multiple functional moieties may be present on the same monomer.

The chromophore moiety $R_1$ may contain any suitable chromophore which (i) can be grafted onto the base polymer, (ii) has suitable radiation absorption characteristics, and (iii) does not adversely affect the performance of the layer or any overlying photoresist layers. Example chromophores include phenyl, chrysenes, pyrenes, fluoroanthrenes, anthrones, benzophenones, thioxanthones, naphthalenes and anthracenes. Approximately 3 to approximately 99 mole % of the monomers of the base polymer may consist of the chromophore moiety $R_1$. The base polymer may include more than one type of chromophore moiety $R_1$.

The transparent moiety $R_2$ may vary depending on the wavelength or character of the patterning radiation. For example, in the case of 193 nm imaging radiation, the transparent moiety $R_2$ may be bulky ($C_2$ or higher) organic moieties substantially free of unsaturated carbon-carbon bonds, preferably an alcohol derived from an epoxy-functionalized silsesquioxane monomer. In the case of 157 nm imaging radiation, the transparent moiety $R_2$ may be fluorine-containing moieties such as a trifluoromethyl group or perfluoroalkyl. The amount of the transparent moiety $R_2$ in the base polymer may be balanced with the amount of the chromophore moiety $R_1$ to provide a desired combination of energy absorption and anti-reflection. Approximately 0.5 to approximately 96.5 mole % of the monomers of the base polymer may consist of the transparent moiety $R_2$. The base polymer may include more than one type of transparent moiety $R_2$.

The reactive moiety $R_3$ provides a site for reaction with a crosslinking component. In some embodiments, reactive moiety $R_3$ may be an alcohol, preferably an aromatic alcohol (e.g., phenol, hydroxymethylbenzyl) or a cycloaliphatic alcohol (e.g. cyclohexanol). Alternatively, a non-cyclic alcohol such as a fluorocarbon alcohol, an aliphatic alcohol, an amino group, a vinyl ether, or an epoxide may be used. In one embodiment, the reactive moiety may be a hydroxyl group. The reactive hydroxyl moiety can react with itself through the known silanol condensation reaction. Approximately 0.5 to approximately 96.5 mole % of the monomers of the base polymer may consist of the reactive moiety $R_3$. The base polymer may include more than one type of the reactive moiety $R_3$.

The SiARC layer 214 may further include a crosslinking agent that can be reacted with the base polymer in a heat-catalyzed manner. Generally, the crosslinking agent may be any suitable crosslinking agent known in the photoresist art which is otherwise compatible with the other selected components of the lithographic structure. The SiARC layer 214 may contain approximately 0.5 to approximately 30% by weight of the crosslinking agent in the total solid.

The non-polymeric silsesquioxane material may contain one or more polyhedral oligomeric silsesquioxane (POSS) materials having acid labile side groups linked to hydrophilic groups. Typical POSS materials have 4-10 polygonal faces. Exemplary POSS materials may have polyhedral structures such as those provided in formulas (IV)-(VI):

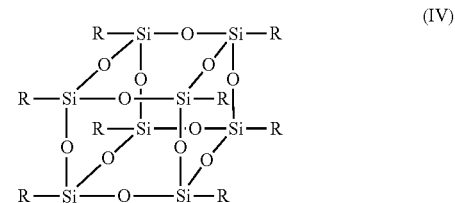

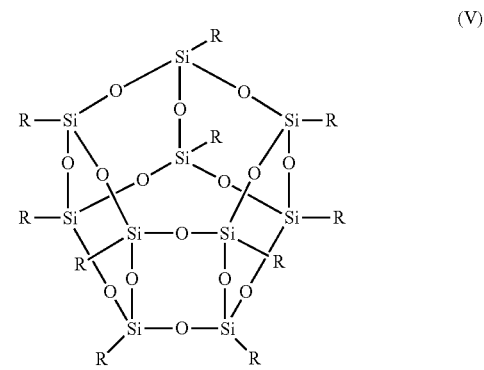

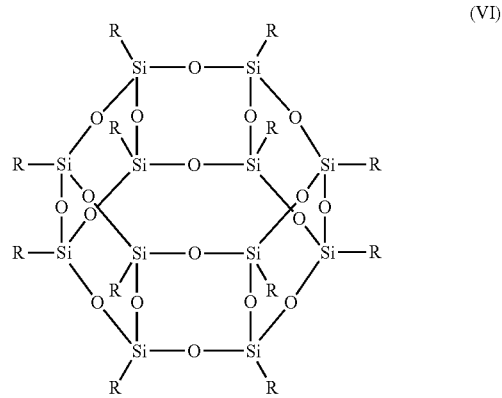

Other POSS materials are explicitly contemplated, including those having open or open cage polyhedral structures. The R groups may consist of an hydrophilic side group protected with an acid labile functionality, so that the R groups, and therefore the entire POSS material, becomes more hydrophilic following cleaving of the acid labile functionality by an acid generated by the PAG. Exemplary acid labile functionalities include tertiary alkyl carbonates, tertiary alkyl esters, tertiary alkyl ethers, acetals and ketals. Exemplary hydrophilic side groups include phenols, alcohols, carboxylic acids, amides, and sulfonamides. Exemplary R groups include structures depicted in formulas (VII)-(IX) below:

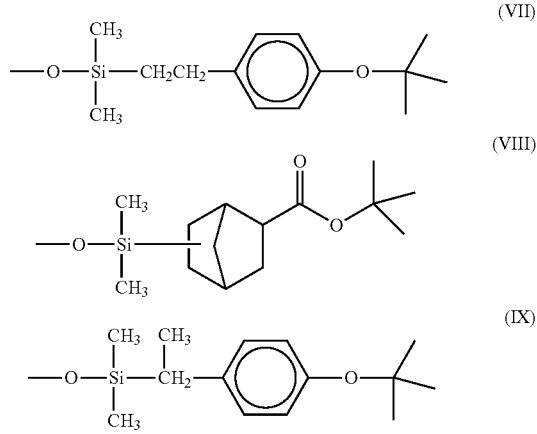

The PAG may be any compound that, upon exposure to radiation, generates a strong acid and is compatible with the other selected components of the lithographic structure. Typical photoacid generators include, for example, sulfonium salts, halonium salts, α, α'-bis-sulfonyl-diazomethanes, trifluoromethanesulfonate esters of imides and hydroxyimides, nitrobenzyl sulfonate esters, sulfonyloxynaphthalimides, pyrogallol derivatives, naphthoquinone-4-diazides, alkyl disulfones, and s-triazine derivatives. Examples of preferred PAGs include, but are not limited to, sulfonates, onium salts, aromatic diazonium salts, sulfonium salts, diaryliodonium salts, and sulfonic acid esters of N-hydroxyamides or N-hydroxyimides. In some embodiments, the PAG may have high thermal stability (i.e., stable to at least 140 degrees Celsius) so that it is not degraded during pre-exposure processing.

The photoresist layer 220 layer may be formed above the ARC layer 210 using spin coating or other known techniques. The photoresist layer 220 may then be heated to remove any solvent and improve the coherence of the resist layer. The thickness of the photoresist layer 220 is preferably as thin as possible while having a substantially planar top surface and being able to withstand subsequent etching processes to transfer the pattern to underlying layers.

The photoresist layer 220 may be made of any known radiation-sensitive polymer suitable for negative tone development systems, wherein exposing the radiation-sensitive polymer to radiation results in the exposed portions becoming more resistant to a solvent than the unexposed portions, for example due to polarity switch and/or radiation-induced crosslinking of the polymer. In some embodiments, the radiation sensitivity of the polymer may be triggered by, or increased by, a PAG. Suitable resist materials may include, but are not limited to, those described in US Published Patent Application Nos. 2012/012203 A1, 2008/0318171 A1, 2009/011366 A1, and 2009/0042147 A1, and U.S. Pat. Nos. 7,851,140 and 8,017,304.

Figure 2B:
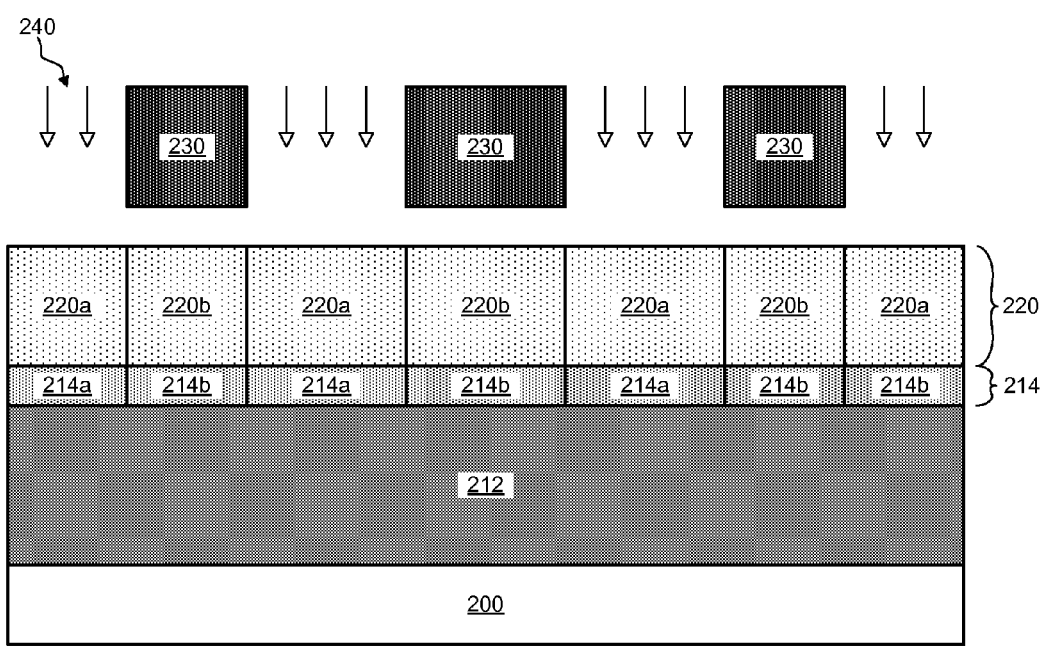
FIG. 2B is a cross-sectional front elevational view of exposing the silicon antireflective layer and the photoresist layer shown in FIG. 2A, according to an embodiment of the present invention.

Referring to FIG. 2B, the photoresist layer 220 (FIG. 2A) is then patternwise exposed to radiation 240 to expose the photoresist layer 220, forming exposed photoresist portions 220a and unexposed photoresist portions 220b. In embodiments where the radiation 240 is generated by a scanning particle beam, patternwise exposure may be achieved by scanning the beam across the substrate and selectively applying the beam in the desired pattern. Where ultraviolet radiation is used, the patternwise exposure may be achieved by passing the radiation 240 through a mask 230 containing transparent portions 230a and opaque portions 230b placed over the photoresist layer 220. During exposure, the radiation mainly passes through the transparent portions 230a and is blocked by the opaque portions 230b.

After the desired patternwise exposure, the photoresist layer 220 may be baked to further complete any reactions of the radiation sensitive polymer and enhance the contrast of the exposed pattern. The post-exposure bake may be conducted, for example, at approximately 60 degrees Celsius to approximately 175 degrees Celsius for approximately 30 seconds to approximately 5 minutes.

Due to the reaction between the radiation-sensitive polymer of the photoresist layer 220, the exposed photoresist portions 220a may be more hydrophilic than the unexposed photoresist layer 220. Without the inclusion of the non-polymeric silsesquioxane material in the ARC layer, this may lead to the exposed photoresist portions 220a adhering relatively poorly to the more hydrophobic SiARC layer 214.

When the non-polymeric silsesquioxane material and the PAG are included in the SiARC layer 214, the radiation 240 may also cause SiARC portions 214a beneath exposed photoresist portions 220a to also become more hydrophilic and improve bonding between the SiARC portions 214a and the exposed photoresist portions 220a. SiARC portions 214a may become more hydrophilic due to a reaction between the PAG and the non-polymeric silsesquioxane material, where acid generated when the PAG is exposed to the radiation 240 cleaves the acid labile functionalities from the non-polymeric silsesquioxane material exposing the relatively hydrophilic side groups of the R group (e.g., phenols, carboxylic acids, etc.). Therefore, the non-polymeric silsesquioxane material becomes more hydrophilic and increases the overall hydrophilicity of the SiARC portions 214a. The exposed photoresist portions 220a thus may adhere better to the SiARC portions 214a, reducing the risk of image collapse.

Figure 2C:
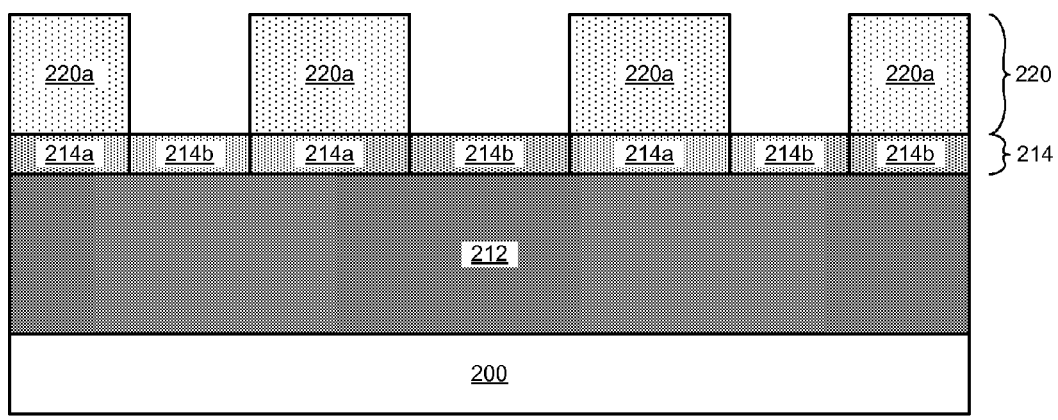
FIG. 2C is a cross-sectional front elevational view of removing the unexposed portions of the photoresist layer, according to an embodiment of the present invention.

Referring to FIG. 2C, the unexposed photoresist portions 220b (FIG. 2B) may be removed using a developer solvent capable of dissolving the unexposed photoresist portions 220b without substantially dissolving the exposed photoresist portions 220a. In one embodiment, the developer solvent is an organic solvent. Exemplary organic solvents may include ethers, glycol ethers, aromatic hydrocarbons, ketones, esters and a combination of two or more of the foregoing solvents. Because the developed photoresist portions 220a adhere better to the SiARC portions 214a due to the inclusion of the non-polymeric silsesquioxane material as described above, it may be relatively easier to remove the undeveloped photoresist portions 220b without substantially disrupting the pattern formed by the developed photoresist portions 220a compared to embodiments where the SiARC layer 214 does not include the non-polymeric silsesquioxane material.

Figure 2D:
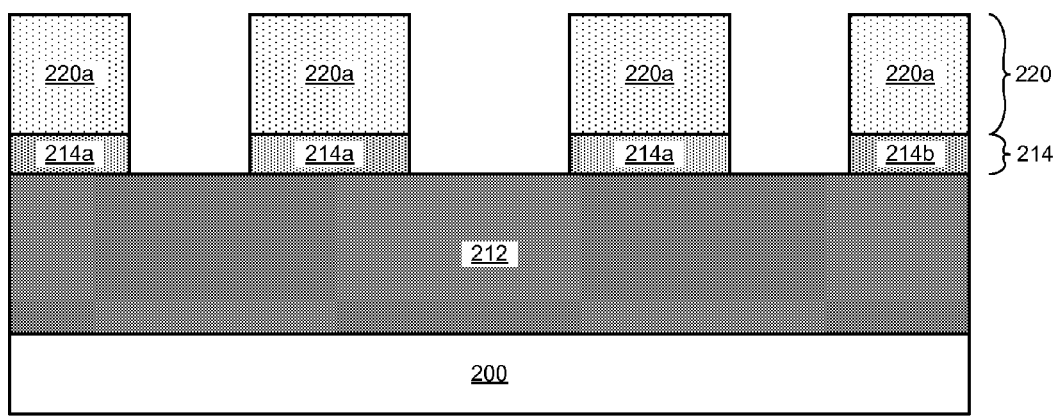
FIG. 2D is a cross-sectional front elevational view of transferring the pattern of the photoresist layer into the silicon antireflective layer, according to an embodiment of the present invention.

Referring to FIG. 2D, the pattern of the photoresist layer 220 defined by the exposed photoresist portions 220a may be transferred into the SiARC layer 214 by removing SiARC portions 214b. The SiARC portions 214b may be removed by etching with $CF_4$ or other suitable etching techniques known in the art. After transferring the pattern into the SiARC layer 214, any remaining portions of the photoresist layer 220 not consumed while etching the SiARC layer 214 may be removed.

Figure 2E:
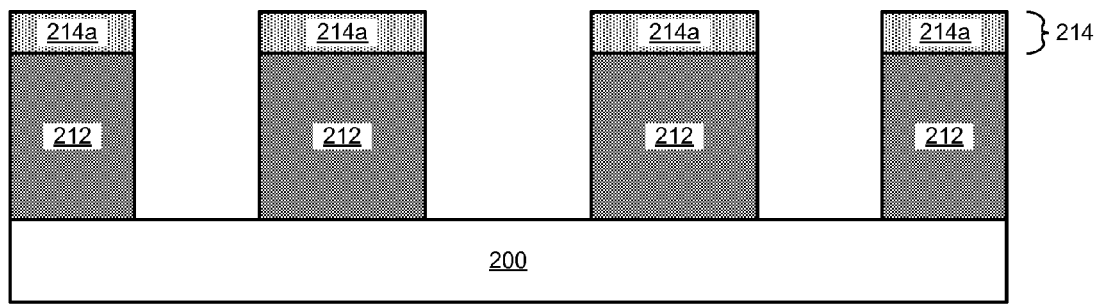
FIG. 2E is a cross-sectional front elevational view of transferring the pattern into the organic antireflective layer, according an embodiment of the present invention.

Referring to FIG. 2E, the pattern may be transferred from the SiARC layer 214 into the organic antireflective layer 212. By using a non-fluorocarbon based etching process, good selectivity between the SiARC layer 214 and the organic antireflective layer 212 may be established as well as full consumption of the photoresist layer 220 (FIG. 2B). In other embodiments, any other suitable etching technique may be used. After transferring the pattern into the organic antireflective layer 212, any remaining portions of the SiARC layer 214 not consumed while etching the organic antireflective layer 212 may be removed.

Figure 2F:
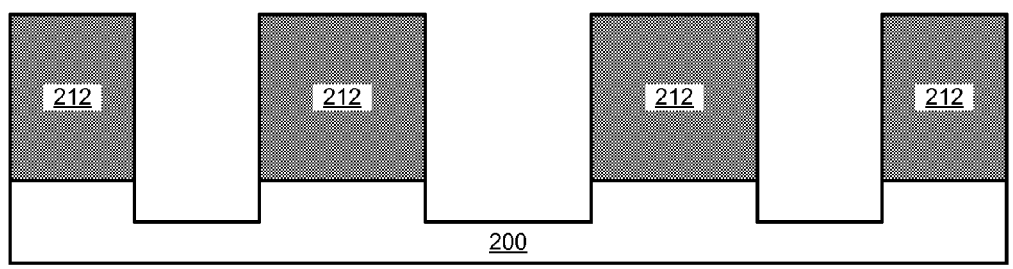
FIG. 2F is a cross-sectional front elevational view of transferring the pattern into the substrate, according to an embodiment of the present invention.

Referring to FIG. 2F, the pattern may be transferred from the organic antireflective layer 212 into the substrate 200. The substrate 200 may be etched using suitable etching techniques known in the art. Appropriate etching techniques may vary depending on the material composition of the substrate 200 and the desired structures to be formed. For example, where the substrate 200 is metal, a $Cl_2/O_2$ combination may be used as dry etching. In another example where the substrate 200 is a dielectric, a fluorocarbon-based reactive ion etch process may be used. After transferring the pattern into the substrate 200, any remaining portions of the organic antireflective layer 212 not consumed while etching the substrate 200 may be removed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Additionally, all starting materials were obtained commercially or were synthesized using known procedures.

Where appropriate, the following techniques and equipment were utilized in the Examples: $^1H$ and $^{13}C$ NMR spectra were obtained at room temperature on an Avance 400 spectrometer. Molecular weights were measured in tetrahydrofuran (THF) on a Waters Model 150 chromatograph relative to polystyrene standards. IR spectra were recorded on a Nicolet 510 FT-IR spectrometer on a film cast on a NaCl plate.

Example 1

Synthesis of the Compound (POSS 1) Having the Following Structure (Structure 1)

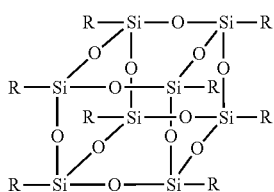

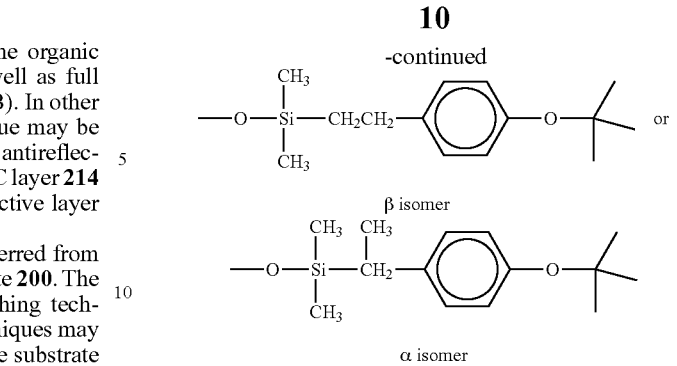

Octakis(dimethylsilyloxy)silsesquioxane $(Q_8M_8^H)$ (7.00 grams, 0.0062 mole)

4-t-butoxystyrene (8.82 grams, 0.050 mole), and anhydrous tetrahydrofuran (THF) (30 ml) were placed in a round bottom flask equipped with a magnetic stirrer, nitrogen inlet, and a water condenser. Platinum(0)-1,3-divinyl-1,1,3,3-tetramethyldisiloxane complex in xylene (0.5 ml) was added to this mixture and the flask was cooled in an ice-water bath and stirred for 30 minutes. Afterwards, the ice-water bath was removed and the mixture was stirred for 18 hours at room temperature. At this time, a small amount of unreacted Si—H was detected by the IR spectrum of a thin film of this mixture on a sodium chloride plate. To drive the reaction to completion, 1 ml of 4-t-butoxystyrene and 0.25 ml of the catalyst were added to the mixture and stirred at room temperature for 30 more minutes. By this time the reaction was complete as indicated by the IR spectrum of the mixture. This solution was then added dropwise into a mixture of 500 ml de-ionized water and 100 ml methanol. The product coagulated and was separated by decantation. It was then dried under vacuum at 60° C. for 18 hours to give 12.92 grams of a brown viscous liquid. The GPC of the material showed a major peak with Mw=2009 and PDI=1.03. In addition, there is a small fraction (13.8%) with Mw=4631 and PDI=1.07. The small fraction is probably a dimer of the desired product, as previously described in the literature for similar reactions. The proton NMR spectrum of this material indicated the presence of a mixture of 2:1 β and α isomers.

Example 2

Synthesis of the Compound (POSS 2) Having the Following Structure (Structure 2)

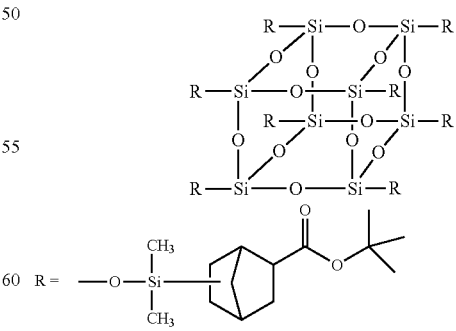

Octakis(dimethylsilyloxy)silsesquioxane $(Q_8M_8^H)$ (8.38 grams, 0.0075 mole)

T-butyl-5-Norbornene-2-carboxylate, mixture of endo and exo, (11.64 grams, 0.06 mole), and tetrahydrofuran (THF)

(40 ml) were placed in a round bottom flask equipped with a magnetic stirrer, nitrogen inlet, and a water condenser. Platinum(0)-1,3-divinyl-1,1,3,3-tetramethyldisiloxane complex in xylene (1 ml) was added to this mixture and the mixture was cooled in ice-water bath and stirred for 1 hour. Afterwards, the bath was removed and stirred for 18 hours at room temperature. The reaction was complete at this time as determined by the IR spectrum of a thin film of the mixture on a sodium chloride plate. This solution was filtered and concentrated in a rotary evaporator. It was then dried under vacuum at 60° C. for 18 hours to give 18.11 grams of a brown viscous liquid. The GPC of the material showed a peak with Mw=1779 and PDI=1.04. In addition, there is a broad shoulder with Mw=5998 and PDI=1.25.

Example 3

Synthesis and formulation of the silicon containing base polymer (Si—HQ). Trimethoxyphenylsilane (6.4 grams), trimethoxymethylsilane (0.5 grams), and tetramethoxysilane (70.6 grams) were added to a mixture of methanol (120 grams), nitric acid (1 gram, 70%) and water (60 grams). The resulting mixture was stirred for 12 hours at 40° C. Propylene glycol ethyl ether (PGEE) (300 grams) was then added to the mixture and methanol and water were evaporated under reduced pressure to obtain PGEE solution of polysiloxane (300 grams, 10 wt %). GPC of the material showed Mw=3400. PGEE solution of polysiloxane (100 grams) was mixed with triphenylsulfonium nonaflate (0.2 grams), PGEE (437.6 grams), and water (92.1 grams), and the resulting solution was filtered through a fluororesin filter with a pore size of 0.2 um.

Example 4

Contact angle measurements of POSS compounds before and after deprotection. POSS 1 and POSS 2 synthesized in Example 1 and 2 were each dissolved in propylene glycol monomethyl ether acetate (PGMEA) to achieve 1.7 wt. % by weight of total solids to obtain two formulations (SiARC-1 and SiARC-3, respectively). A thermal acid generator (TAG) consisting of triethylammonium nonafluorobutane sulfonate in PGMEA solution (1.7 Wt.%) was added in a concentration of 5 parts by weight (relative to POSS) to portions of SiARC-1 and SiARC-3 to obtain two additional formulations (SiARC-2 and SiARC-4, respectively). The formulated casting solutions were filtered through a PTFE membrane (0.2 μm pore size). They were then spin coated onto 57 mm silicon wafers at 1500 rpm for 40 seconds and baked at 220° C. for 60 seconds. The contact angles measured on these wafers with DI water are shown in Table 1 below:

TABLE 1

| Sample | Formulation | Contact Angle (DI water) |
| --- | --- | --- |
| SiARC-1 | POSS 1, no TAG | 77° |
| SiARC-2 | POSS 1, with 5% TAG | 57° |
| SiARC-3 | POSS 2, no TAG | 85° |
| SiARC-4 | POSS 2, with 5% TAG | 74° |

Example 5

Solvent resistance test of SiARC formulations with different ratio of POSS and Si-containing base polymer. Formulations with different ratio of POSS and Si-containing base polymer (SiARC-5, SiARC-6, SiARC-7, SiARC-8, SiARC-9, SiARC-10) were obtained through the mixing of one of the formulations of Example 4 (SiARC-1) and the formulation of Example 3 (Si—HQ). These formulations were then spin coated onto 57 mm silicon wafers at 1500 rpm for 40 seconds and baked at 220° C. for 60 seconds. The solvent resistance test was carried out by constant spraying of a pre-rinse solvent containing 70% γ-butyrolactone and 30% n-butyl acetate onto a spinning wafer for 20 seconds. The wafers then were baked again at 110° C. for 60 seconds to remove any residual solvent on the wafer surface. The thickness and contact angles of these wafers were measured before and after rinse. Significant film lost was observed for >10% SiARC-1. The results of the test are shown in Table 2 below:

TABLE 2

| Sample | Formulation | CA before rinse | CA after rinse | Thickness before rinse | Thickness after rinse |
| --- | --- | --- | --- | --- | --- |
| SiARC-5 | 0% SiARC-1, 100% Si-HQ | 44° | 44° | 33.9 nm | 34.1 nm |
| SiARC-6 | 5% SiARC-1, 95% Si-HQ | 76° | 71° | 34.4 nm | 34.2 nm |
| SiARC-7 | 10% SiARC-1, 90% Si-HQ | 88° | 87° | 34.8 nm | 32.8 nm |
| SiARC-8 | 20% SiARC-1, 80% Si-HQ | 92° | 88° | 35.0 nm | 30.3 nm |
| SiARC-9 | 30% SiARC-1, 70% Si-HQ | 88° | 86° | 35.1 nm | 29.0 nm |
| SiARC-10 | 100% SiARC-1, 0% Si-HQ | 82° | 78° | 39.3 nm | 19.5 nm |

Example 6

Flood exposure test of SiARC formulations with different ratio of POSS-1 and Si-containing base polymer. Formulations with different ratio of POSS-1 and Si-containing base polymer (SiARC-11, SiARC-12, SiARC-13) were obtained through the mixing of one of the formulations of Example 4 (SiARC-1) and the formulation of Example 3 (Si—HQ). These formulations were then spin coated onto 57 mm silicon wafers at 1500 rpm for 40 seconds and baked at 220° C. for 60 seconds. The wafers were flood exposed with broad band UV light and then baked at 110° C. for 60 seconds. Contact angles were measured before and after exposures. The wafers after exposure exhibited more hydrophilic surface than the same wafers before exposure. The results of the test are shown in the Table 3 below:

TABLE 3

| Sample | Formulation | CA before exposure | CA after exposure |
| --- | --- | --- | --- |
| SiARC-11 | 1% SiARC-1, 99% Si-HQ | 64° | 51° |
| SiARC-12 | 3% SiARC-1, 97% Si-HQ | 69° | 54° |
| SiARC-13 | 5% SiARC-1, 95% Si-HQ | 79° | 69° |

Example 7

Flood exposure test of SiARC formulations with different ratio of POSS-2 and Si-containing base polymer. 3 wt % (relative to POSS-2) of triphenyl nonafluorobutane sulfonate was added to SiARC-3 formulation of Example 4 to obtain a new formulation of SiARC-3P. Various formulations of different ratio of POSS-2 and Si-containing base polymer (SiARC-14, SiARC-15, SiARC-16, SiARC-17, SiARC-18, SiARC-19, SiARC-20) were obtained through the mixing of SiARC-3P and the formulation of Example 3 (Si—HQ). These formulations were then spin coated onto 57 mm silicon wafers at 1500 rpm for 40 seconds and baked at 220° C. for 60 seconds. The wafers were flood exposed with broad band UV light and then baked at 110° C. for 60 seconds. Contact angles were measured before and after exposures. The wafers after exposures exhibited more hydrophilic surface than the same wafers before exposures. The results of the test are shown in the Table 4 below:

TABLE 4

| Sample | Formulation | CA before exposure | CA after exposure |
| --- | --- | --- | --- |
| SiARC-14 | 3% SiARC-3P, 97% Si-HQ | 50° | 46° |
| SiARC-15 | 4% SiARC-3P, 96% Si-HQ | 56° | 46° |
| SiARC-16 | 5% SiARC-3P, 95% Si-HQ | 79° | 69° |
| SiARC-17 | 10% SiARC-3P, 90% Si-HQ | 86° | 83° |
| SiARC-18 | 20% SiARC-3P, 80% Si-HQ | 86° | 86° |
| SiARC-19 | 30% SiARC-3P, 70% Si-HQ | 86° | 87° |
| SiARC-20 | 100% SiARC-3P, 0% Si-HQ | 86° | 86° |

Example 8

Lithographic evaluation of SiARC formulation with POSS 1. A simple lithographic evaluation was performed with the goal of quantifying the process window performance of the NTD SiARC materials. For this experiment, SiARC-6 formulated in Example 5 was compared to the state of art commercially available NTD SiARC material, SHB-N04 (from Shin-Etsu Co.). Before coating NTD SiARC material, an OPL material (ODL-401, from Shin-Etsu Co.) was spin-coated onto a 300 mm bare-Si wafer, and then was baked at 250° C. for 90 seconds to obtain about 135 nm thick of OPL film. Secondly, the NTD SiARC material under investigation was coated on top of OPL and then baked at 220° C. for 60 seconds to obtain about 35 nm thick of SiARC film. Subsequently, a 193 nm photoresist material, AIM7210 (from Japan Synthetic Rubber Co.) was applied on top of the NTD SiARC and then baked at 90° C. for 60 seconds to obtain about 100 nm thick of photoresist film. Finally, the whole material stack was exposed with 193 nm immersion exposure tool having 1.35 NA (numerical aperture), and then baked at 95° C. for 60 seconds, and developed with 2-heptanone to form the desired patterns. Eighty nine measurements were collected within a single wafer using an SEM tool. After collecting the wafer data and extracting the single measurements, the wafer results were plotted using Windblast (IBM internal software). This yields to the results of the exposure latitude (EL) and depth of focus (DOF) for SiARC-6 and SHB-N04 as the following: SiARC-6: DOF at 5%EL~0.10 um and SHB-N04: DOF at 5% EL~0.10 um.

What is claimed is:

1. An antireflective material, comprising:
   a silicon-containing base polymer;
   a non-polymeric silsesquioxane material; and
   a photoacid generator (PAG),
   wherein the non-polymeric silsesquioxane material comprises a polyhedral oligomeric silsesquioxane (POSS) having a hydrophilic side group protected with an acid labile functionality; wherein the antireflective material contains 80-99 wt. % of the silicon-containing base polymer and 0.5-10 wt. % of the non-polymeric silsesquioxane material.

2. The antireflective material of claim 1, wherein the silicon-containing base polymer comprises one or more monomers selected from the group consisting of:

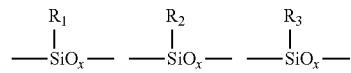

wherein x ranges from approximately 1 to approximately 2, $R_1$ is a chromophore moiety, $R_2$ is a transparent moiety, and $R_3$ is a reactive site for reaction with a crosslinking component.

3. The antireflective material of claim 2, wherein the silicon-containing base polymer further comprises a crosslinking agent.

4. The antireflective material of claim 1, wherein the acid labile functionality is selected from the group consisting of tertiary alkyl carbonates, tertiary alkyl esters, tertiary alkyl ethers, acetals and ketals.

5. The antireflective material of claim 1, wherein the hydrophilic side group is selected from the group consisting of phenols, alcohols, carboxylic acids, amides, and sulfonamides.

6. The antireflective material of claim 1, wherein the hydrophilic side group protected with the acid labile functionality has a formula selected from the group consisting of:

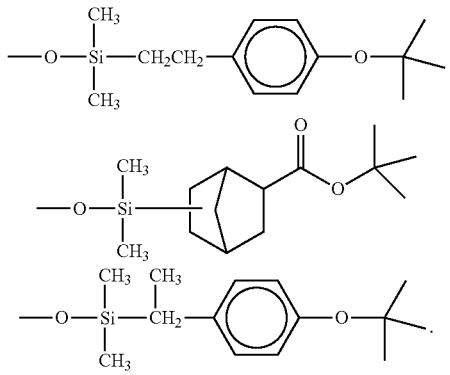

7. The antireflective material of claim 1, wherein the PAG is selected from the group consisting of sulfonium salts, halonium salts, α, α'-bis-sulfonyl-diazomethanes, trifluoromethanesulfonate esters of imides and hydroxyimides, nitrobenzyl sulfonate esters, sulfonyloxynaphthalimides, pyrogallol derivatives, naphthoquinone-4-diazides, alkyl disulfones, and s-triazine derivatives.

8. A lithographic structure, comprising:
   an organic antireflective layer;
   a silicon-containing antireflective layer above the organic antireflective material, wherein the silicon-containing antireflective layer comprises a silicon-containing base polymer, a non-polymeric silsesquioxane material, and a photoacid generator;
   a photoresist layer above the silicon-containing antireflective layer; and
   wherein the non-polymeric silsesquioxane material comprises a polyhedral oligomeric silsesquioxane (POSS) having a hydrophilic side group protected with an acid labile functionality.

9. The lithographic structure of claim 8, wherein the organic antireflective layer is selected from the group comprising poly(4-hydroxystyrene), co-polymers of 4-hydroxystyrene with up 40% by weight of alkyl methacrylate, alkylacrylate, and/or styrene, novolac resins, acrylate polymers, methacrylate polymers, fluorocarbon polymers, cycloaliphatic polymers such norbornene-based and maleic anhydride polymers, poly(3-hydroxystyrene), poly(acrylic acid), poly(norbornene carboxylic acid), copolymers of (4-hydroxystyrene and styrene), copolymers of 4-hydroxystyrene and acrylic acid, copolymers of styrene and acrylic acid, and copolymers of norbornene and maleic anhydride.

10. The lithographic structure of claim 8, wherein the acid labile functionality is selected from the group consisting of tertiary alkyl carbonates, tertiary alkyl esters, tertiary alkyl ethers, acetals and ketals.

11. The lithographic structure of claim 8, wherein the hydrophilic side group is selected from the group consisting of phenols, alcohols, carboxylic acids, amides, and sulfonamides.

12. The lithographic structure of claim 8, wherein the hydrophilic side group protected with the acid labile functionality has a formula selected from the group consisting of:

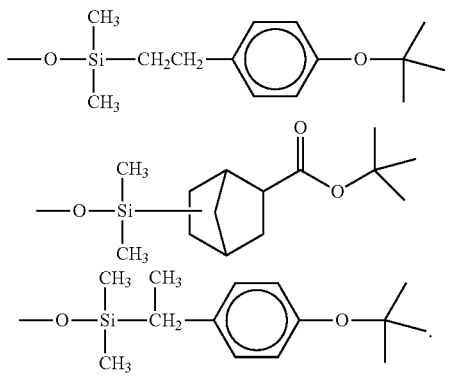

13. The lithographic structure of claim 8, wherein the photoresist layer comprises a radiation-sensitive polymer suitable for negative tone development systems.

14. A method of forming a lithographic structure, comprising:
    depositing an organic antireflective coating above a substrate;
    depositing a silicon-containing antireflective layer above the organic antireflective material, wherein the silicon-containing antireflective layer comprises a silicon-containing base polymer, a non-polymeric silsesquioxane material, and a photoacid generator;
    depositing a photoresist layer above the silicon-containing antireflective layer, wherein the photoresist layer comprises a radiation-sensitive polymer suitable for negative tone development systems;
    patternwise exposing the photoresist layer to radiation to create regions exposed to radiation and regions not exposed to radiation in the photoresist layer;
    developing the photoresist layer to form a pattern in the photoresist layer comprising the regions of the photoresist layer exposed to radiation;
    transferring the pattern of the photoresist layer into the silicon-containing antireflective layer;
    transferring the pattern of the silicon-containing antireflective layer into the organic antireflective layer; and
    transferring the pattern of the organic antireflective layer into the substrate,
    wherein the non-polymeric silsesquioxane material comprises a polyhedral oligomeric silsesquioxane (POSS) having a hydrophilic side group protected with an acid labile functionality.

15. The method of claim 14, wherein the acid labile functionality is selected from the group consisting of tertiary alkyl carbonates, tertiary alkyl esters, tertiary alkyl ethers, acetals, and ketals.

16. The method of claim 14, wherein the hydrophilic side group is selected from the group consisting of phenols, alcohols, carboxylic acids, amides, and sulfonamides.

17. The method of claim 14, wherein the hydrophilic side group protected with the acid labile functionality has a formula selected from the group consisting of:

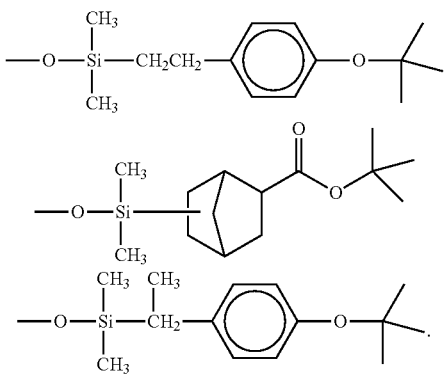

* * * * *